US012571850B2

(12) United States Patent (10) Patent No.: US 12,571,850 B2
Kubotani et al. (45) Date of Patent: Mar. 10, 2026

(54) STORAGE BATTERY MANAGEMENT DEVICE, STORAGE BATTERY SYSTEM, AND STORAGE BATTERY MANAGEMENT METHOD

(71) Applicant: KYOCERA CORPORATION, Kyoto (JP)

(72) Inventors: Tsuyoshi Kubotani, Osaka (JP); Yuki Oda, Osaka (JP); Hiromitsu Mishima, Daito (JP); Masahiro Baba, Kawasaki (JP)

(73) Assignee: KYOCERA CORPORATION, Kyoto (JP)

( * ) Notice: Subject to any disclaimer, the term of this patent is extended or adjusted under 35 U.S.C. 154(b) by 871 days.

(21) Appl. No.: 17/755,439

(22) PCT Filed: Oct. 27, 2020

(86) PCT No.: PCT/JP2020/040304
§ 371 (c)(1),
(2) Date: Apr. 28, 2022

(87) PCT Pub. No.: WO2021/085433
PCT Pub. Date: May 6, 2021

(65) Prior Publication Data
US 2022/0390523 A1 Dec. 8, 2022

(30) Foreign Application Priority Data
Oct. 29, 2019 (JP) ................................. 2019-196696

(51) Int. Cl.
*G01R 31/392* (2019.01)
*G01R 31/385* (2019.01)
(Continued)

(52) U.S. Cl.
CPC ......... *G01R 31/392* (2019.01); *G01R 31/385* (2019.01); *H01M 10/48* (2013.01); *H02J 7/005* (2020.01)

(58) Field of Classification Search
CPC ................................................... G01R 31/392
See application file for complete search history.

(56) References Cited

U.S. PATENT DOCUMENTS 10,557,892 B2 2/2020 Suzuki et al.
2011/0210859 A1 9/2011 Kim
2017/0328957 A1* 11/2017 Suzuki .................. H01M 10/48

FOREIGN PATENT DOCUMENTS

CN 107209228 A 9/2017
EP 1933158 A1 6/2008
(Continued)

OTHER PUBLICATIONS

Motokura, JP2019161791, Secondary Battery Temperature Control System and Temperature Control Method, 2019.*

*Primary Examiner* — Tynese V McDaniel
(74) *Attorney, Agent, or Firm* — HAUPTMAN HAM, LLP

(57) ABSTRACT

A storage battery management device includes a control unit. The control unit obtains a current value of a current flowing through a storage battery, a temperature of the storage battery, and a charging rate of the storage battery during a target period. The control unit determines an operation mode of the storage battery during the target period on the basis of the current value and the charging rate. The control unit estimates a degree of degradation of the storage battery during the target period on the basis of the operation mode and the temperature.

14 Claims, 8 Drawing Sheets

(51) Int. Cl.
H01M 10/48 (2006.01)
H02J 7/00 (2006.01)

(56) References Cited

FOREIGN PATENT DOCUMENTS

| EP | 2944501 A2 | 11/2015 | |
|----|------------|---------|---|
| JP | 201734814 A | 2/2017 | |
| JP | 2019161791 | * 9/2019 | ............ Y02E 60/10 |
| JP | 2019161791 A | 9/2019 | |
| WO | 2016092811 A1 | 6/2016 | |

* cited by examiner

FIG. 6

| OPERATION MODE | ACTIVE MODE/RETENTION MODE | FLUCTUATION RANGE OF CHARGING RATE |
|---|---|---|
| OPERATION MODE 1 | ACTIVE MODE | 20% TO 100% |
| OPERATION MODE 2 | ACTIVE MODE | 0% TO 100% |
| OPERATION MODE 3 | ACTIVE MODE | 0% TO 20% |
| OPERATION MODE 4 | ACTIVE MODE | 80% TO 100% |
| OPERATION MODE 5 | ACTIVE MODE | 20% TO 80% |
| OPERATION MODE 6 | RETENTION MODE | 100% |
| OPERATION MODE 7 | RETENTION MODE | 80% TO 99% |
| OPERATION MODE 8 | RETENTION MODE | 20% TO 80% |
| OPERATION MODE 9 | RETENTION MODE | 0% TO 20% |

FIG. 7

| DEGRADATION INDEX β | | OPERATION MODE 1 | OPERATION MODE 2 | OPERATION MODE 3 | OPERATION MODE 4 | OPERATION MODE 5 |
|---|---|---|---|---|---|---|
| | | 0.5 | 0.6 | 0.5 | 0.5 | 0.4 |
| REACTION RATE CONSTANT α | TEMPERATURE (°C) | | | | | |
| | 0 | 0.150 | 0.050 | 0.050 | 0.150 | 0.150 |
| | ... | ... | ... | ... | ... | ... |
| | 24 | 0.350 | 0.110 | 0.055 | 0.110 | 0.110 |
| | 25 | 0.360 | 0.120 | 0.060 | 0.120 | 0.120 |
| | 26 | 0.380 | 0.140 | 0.070 | 0.140 | 0.140 |
| | ... | ... | ... | ... | ... | ... |

| DEGRADATION INDEX β' | | LOW-TEMPERATURE ACTIVE MODE |
|---|---|---|
| | | 0.7 |
| REACTION RATE CONSTANT α' | TEMPERATURE (°C) | |
| | 0 | 0.100 |
| | ... | ... |
| | 24 | 0.003 |
| | 25 | 0.002 |
| | 26 | — |
| | ... | — |

FIG. 8

| DEGRADATION INDEX β | | OPERATION MODE 6 | OPERATION MODE 7 | OPERATION MODE 8 | OPERATION MODE 9 |
|---|---|---|---|---|---|
| | | 0.4 | 0.4 | 0.4 | 0.4 |
| REACTION RATE CONSTANT α | TEMPERATURE (°C) | | | | |
| | ... | ... | ... | ... | ... |
| | 39 | 0.510 | 0.337 | 0.255 | 0.255 |
| | 40 | 0.520 | 0.343 | 0.260 | 0.260 |
| | 41 | 0.535 | 0.353 | 0.268 | 0.268 |
| | ... | ... | ... | ... | ... |
| | 70 | 0.580 | 0.383 | 0.290 | 0.290 |

| DEGRADATION INDEX β'' | | HIGH-TEMPERATURE RETENTION MODE |
|---|---|---|
| | | 0.6 |
| REACTION RATE CONSTANT α'' | TEMPERATURE (°C) | |
| | ... | — |
| | 39 | — |
| | 40 | 0.001 |
| | 41 | 0.002 |
| | ... | ... |
| | 70 | 0.040 |

STORAGE BATTERY MANAGEMENT DEVICE, STORAGE BATTERY SYSTEM, AND STORAGE BATTERY MANAGEMENT METHOD

CROSS-REFERENCE TO RELATED APPLICATION(S)

This application is a national stage application of International Application No. PCT/JP2020/040304, filed on Oct. 27, 2020, and which is based upon and claims the benefit of priority to Japanese Patent Application No. 2019-196696 filed on Oct. 29, 2019, the disclosure of which is incorporated herein by reference in its entirety.

TECHNICAL FIELD

The present disclosure relates to a storage battery management device, a storage battery system, and a storage battery management method.

To manage storage batteries, techniques for grasping the degradation states of storage batteries are currently known. For example, it is known a technique in which the amount of electric power discharged during a period in which a storage battery is fully charged and subsequently fully discharged is measured to thereby measure the degree of degradation (SOH: State of Health) that is an indicator indicating the state of degradation of the storage battery.

SUMMARY OF INVENTION

A storage battery management device according to an embodiment of the present disclosure includes a control unit. The control unit obtains a current value of a current flowing through a storage battery, a temperature of the storage battery, and a charging rate of the storage battery during a target period. The control unit determines an operation mode of the storage battery during the target period on the basis of the current value and the charging rate. The control unit estimates a degree of degradation of the storage battery during the target period on the basis of the operation mode and the temperature.

A storage battery system according to an embodiment of the present disclosure includes: a storage battery; and a storage battery management device including a control unit. The control unit obtains a current value of a current flowing through the storage battery, a temperature of the storage battery, and a charging rate of the storage battery during a target period. The control unit determines an operation mode of the storage battery during the target period on the basis of the current value and the charging rate. The control unit estimates a degree of degradation of the storage battery during the target period on the basis of the operation mode and the temperature.

A storage battery management method according to an embodiment of the present disclosure is a storage battery management method to be performed by a storage battery management device including a control unit. The storage battery management method includes a step, by the control unit, of obtaining a current value of a current flowing through a storage battery, a temperature of the storage battery, and a charging rate of the storage battery during a target period. The storage battery management method includes a step, by the control unit, of determining an operation mode of the storage battery during the target period on the basis of the current value and the charging rate. The storage battery management method includes a step, by the control unit, of estimating a degree of degradation of the storage battery during the target period on the basis of the operation mode and the temperature.

BRIEF DESCRIPTION OF DRAWINGS

FIG. 6 is a diagram illustrating a plurality of example operations modes.

FIG. 7 is a diagram illustrating example correspondences between conditions of operations modes in which and temperatures at which a storage battery is operated, and information used to estimate the degree of degradation of the storage battery.

FIG. 8 is a diagram illustrating other example correspondences between conditions of operations modes in which and temperatures at which a storage battery is operated, and information used to estimate the degree of degradation of the storage battery.

DESCRIPTION OF EMBODIMENTS

Figure 1:
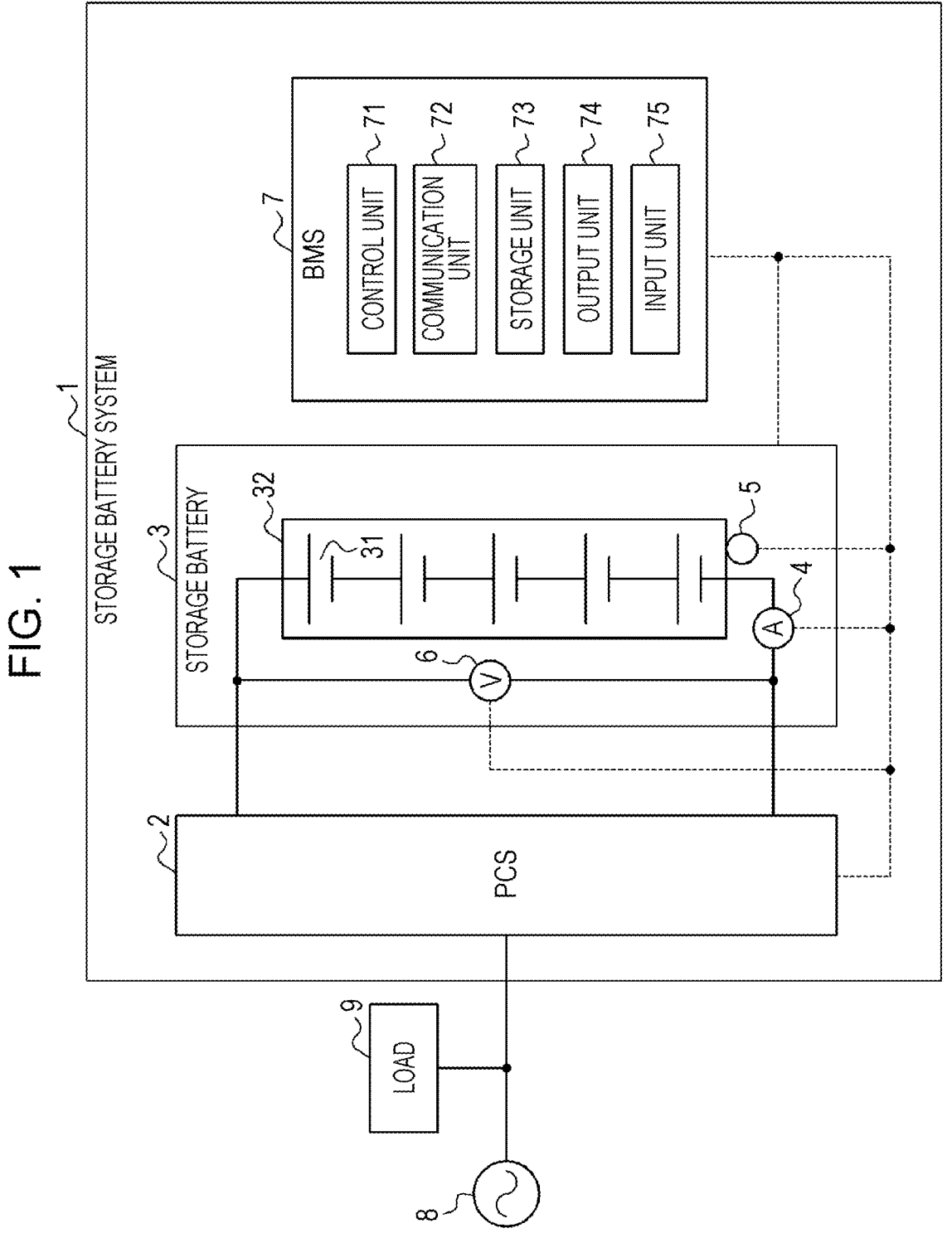
FIG. 1 is a schematic configuration diagram of a storage battery system according to one embodiment of the present disclosure.

To measure the degree of degradation of a storage battery by fully discharging the storage battery, it is generally required to operate the storage battery in a specific operation state, such as "degree-of-degradation measurement mode". In this case, the use of the storage battery, such as charging, is restricted during measurement of the degree of degradation of the storage battery. Accordingly, there is a demand for estimating the degree of degradation of a storage battery on the basis of information obtained without operating the storage battery in a specific operation state to thereby increase the usefulness of the technique for managing the storage battery.

An object of the present disclosure made in view of the above-described circumstances is to provide a storage battery management device, a storage battery system, and a storage battery management method with which the usefulness of the technique for managing a storage battery is increased.

Hereinafter, one embodiment of the present disclosure will be described with reference to the drawings.

In the drawings, the same or equivalent parts are assigned the same reference numerals. In the description of this embodiment, descriptions of the same or equivalent parts are omitted or briefly given as appropriate.

(Configuration of Storage Battery System)

FIG. 1 is a schematic configuration diagram of a storage battery system 1 according to one embodiment of the present disclosure. The storage battery system 1 includes a power conditioner 2, a storage battery 3, a current sensor 4, a temperature sensor 5, a voltage sensor 6, and a storage battery management device 7. The power conditioner 2 is also referred to as a PCS (Power Conditioning System). The storage battery management device 7 is also referred to as a BMS (Battery Management System). In the storage battery system 1, the storage battery 3 is connected to, for example, an electric power system 8 and a load 9 outside the storage battery system 1 via the power conditioner 2. Accordingly, the storage battery system 1 can supply electric power stored in the storage battery 3 to, for example, the electric power system 8 and the load 9. Further, the storage battery system 1 can store electric power supplied from, for example, the electric power system 8 in the storage battery 3.

As depicted by dashed lines in FIG. 1, the power conditioner 2, the storage battery 3, the current sensor 4, the temperature sensor 5, the voltage sensor 6, and the storage battery management device 7 are connected to each other by wire or wirelessly via a network, such as a CAN (Controller Area Network), such that communication is possible. In this embodiment, although a description is given under the assumption that the storage battery system 1 includes one power conditioner 2, one storage battery 3, one current sensor 4, one temperature sensor 5, one voltage sensor 6, and one storage battery management device 7 as illustrated in FIG. 1, the number of each of these elements may be any number.

The power conditioner 2 converts DC power externally discharged from the storage battery 3 to AC power and converts AC power externally supplied to the storage battery 3 to DC power.

The storage battery 3 is, for example, a chargeable and dischargeable battery, such as a lithium-ion battery. The storage battery 3 includes a storage battery module 32 constituted by one or more cells 31. The storage battery 3 can store electric power in the cells 31 that constitute the storage battery module 32 or discharge electric power from the cells 31. In this embodiment, although a description is given under the assumption that a plurality of cells 31 are connected in series in the storage battery module 32, the cells 31 may be connected in parallel. Further, in the storage battery 3, a plurality of storage battery modules 32 may be connected in series or in parallel.

The current sensor 4 measures the current value of the current flowing through the storage battery 3. The current value of the current flowing through the storage battery 3 includes at least one of the current value of the current input to the storage battery 3 or the current value of the current output from the storage battery 3. The current sensor 4 transmits the measured current value to, for example, the storage battery management device 7 as the current value of the current flowing through the storage battery 3. In this embodiment, the current sensor 4 is connected to one of the terminals of the storage battery module 32 in series. However, the current sensor 4 need not be connected to one of the terminals of the storage battery module 32 and may be connected to any position at which the current value of the current flowing through the storage battery 3 can be measured.

The temperature sensor 5 measures the temperature of the storage battery 3. The temperature sensor 5 transmits the measured temperature to, for example, the storage battery management device 7 as the temperature of the storage battery 3. In this embodiment, the temperature sensor 5 is placed on the external surface of one of the terminals of the storage battery module 32. However, the temperature sensor 5 need not be placed on the external surface of one of the terminals of the storage battery module 32 and may be placed at any position at which the temperature of the storage battery 3 can be measured.

The voltage sensor 6 measures the voltage value of the storage battery 3. The voltage sensor 6 transmits the measured voltage value to, for example, the storage battery management device 7 as the voltage value of the storage battery 3. The voltage value of the storage battery 3 includes, for example, the voltage value during charging or discharging or the value of the open-circuit voltage in a state in which no current is flowing. In this embodiment, the voltage sensor 6 is connected to the storage battery module 32 in parallel at both terminals. However, the voltage sensor 6 need not be connected to the storage battery module 32 at both terminals and may be placed at any position at which the voltage value of the storage battery 3 can be measured.

The storage battery management device 7 manages the storage battery 3. The storage battery management device 7, for example, controls the power of the storage battery 3 to turn on or off or controls, for example, transmission of information from the storage battery 3 to the storage battery management device 7.

In the storage battery system 1 according to one embodiment of the present disclosure, the storage battery management device 7 communicates with, for example, the current sensor 4, the temperature sensor 5, and the voltage sensor 6 and obtains the current value of the current flowing through the storage battery 3, the temperature of the storage battery 3, and the charging rate of the storage battery 3. On the basis of the obtained current value, temperature, and charging rate of the storage battery 3, the storage battery management device 7 determines the operation mode of the storage battery 3 and estimates the degree of degradation. As described above, the degree of degradation of the storage battery 3 is estimated on the basis of information obtained without operating the storage battery 3 in a specific operation state to thereby increase the usefulness of the technique for managing the storage battery 3.

The degree of degradation of the storage battery 3 is expressed by the SOH (State of Health). The SOH is the ratio (%) of the current full charge capacity (FCC) to the design capacity (DC). The design capacity may be, for example, the initial value of the full charge capacity of the storage battery 3 specified by the manufacturer of the storage battery 3. The charging rate of the storage battery 3 is expressed by the SOC (State of Charge). The SOC is the ratio (%) of the current charge amount to the current full charge capacity.

In the present disclosure, the operation state of the storage battery 3 is also referred to as the operation mode in the following description. The operation mode of the storage battery 3 includes an active mode that is an operation state in which the storage battery 3 is charged or discharged and a retention mode that is an operation state in which the storage battery 3 retains electric power. In addition to the active mode and the retention mode, the operation mode of the storage battery 3 may include, for example, a degree-of-degradation measurement mode that is a specific operation state for measuring the degree of degradation of the storage battery 3.

(Configuration of Storage Battery Management Device)

With reference to FIG. 1, the overall configuration of the storage battery management device 7 according to this embodiment will be described. As illustrated in FIG. 1, the storage battery management device 7 includes a control unit 71, a communication unit 72, a storage unit 73, an output unit 74, and an input unit 75. The control unit 71, the communication unit 72, the storage unit 73, the output unit 74, and the input unit 75 are connected to each other by wire or wirelessly such that communication is possible.

The control unit 71 include at least one processor. The processor may be, for example, a general-purpose processor, such as a CPU (Central Processing Unit), or a dedicated processor specialized in a specific process. The control unit 71 need not include the processor and may include at least one dedicated circuit. The dedicated circuit may be, for example, an FPGA (Field-Programmable Gate Array) or an ASIC (Application-Specific Integrated Circuit). The control unit 71 controls the communication unit 72, the storage unit 73, the output unit 74, and the input unit 75 described above to implement the functions of the storage battery management device 7. Control performed by the control unit 71 and characteristic of this embodiment will be further described below.

The communication unit 72 includes at least one communication module. The communication module is, for example, a CAN communication module, a wired LAN (Local Area Network) communication module, or a wireless LAN communication module. In this embodiment, the storage battery management device 7 can communicate with, for example, the power conditioner 2, the storage battery 3, the current sensor 4, the temperature sensor 5, and the voltage sensor 6 included in the storage battery system 1 via the communication unit 72.

The storage unit 73 is, for example, a semiconductor memory, a magnetic memory, or an optical memory. The storage unit 73 functions as, for example, a main storage device and an auxiliary storage device. The storage unit 73 may be, for example, a cache memory of the processor included in the control unit 71. The storage unit 73 may be a volatile storage device or a nonvolatile storage device. The storage unit 73 stores, for example, a system program, an application program, built-in software, and information for implementing the functions of the storage battery management device 7.

The output unit 74 outputs information as, for example, an image and sound. The output unit 74 includes, for example, output devices, such as a display and a speaker.

The input unit 75 accepts input operations. The input unit 75 may include, for example, input devices, such as a touch panel and a remote controller.

(Example Process Performed by Storage Battery Management Device)

Figure 2:
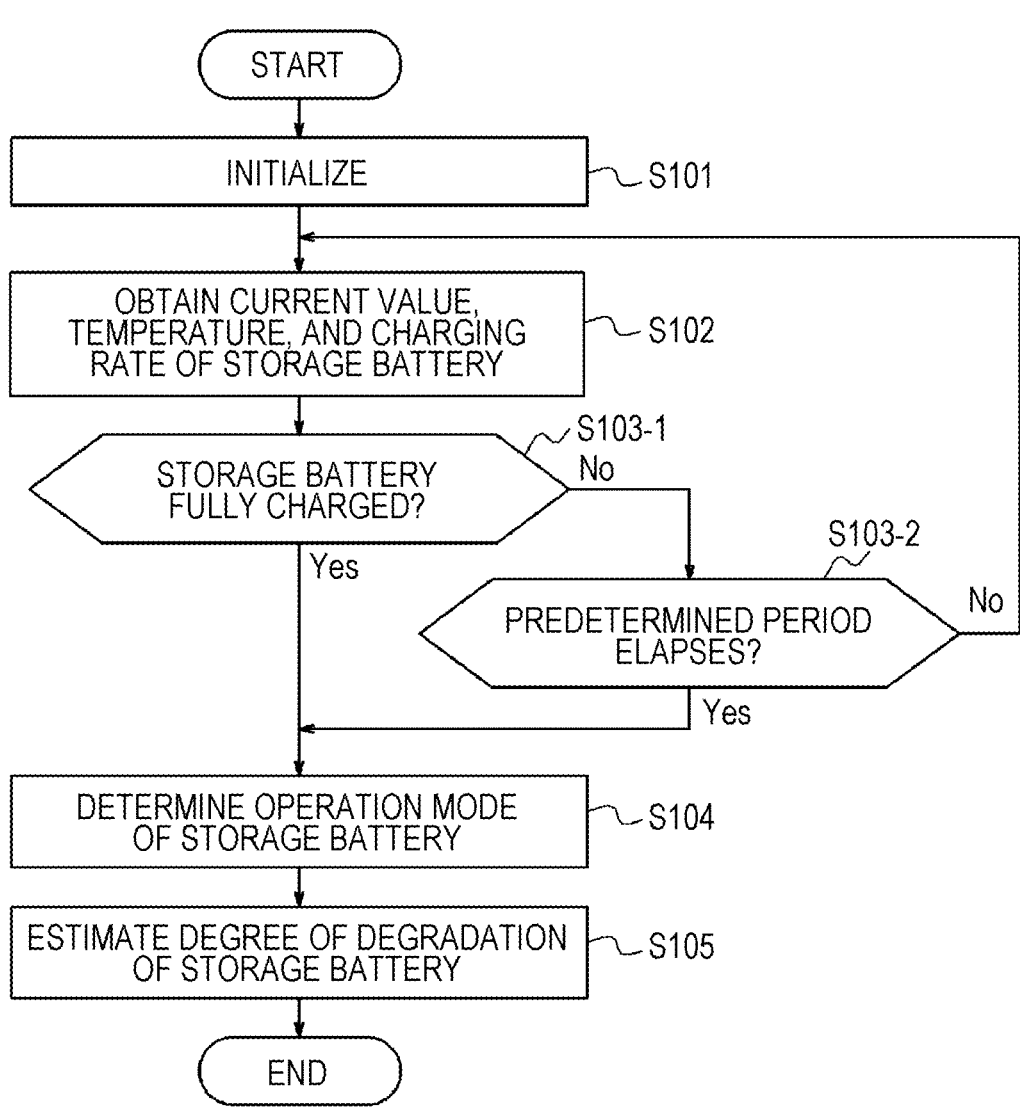
FIG. 2 is a flowchart of an example process performed by a storage battery management device illustrated in FIG. 1.
Figure 3:
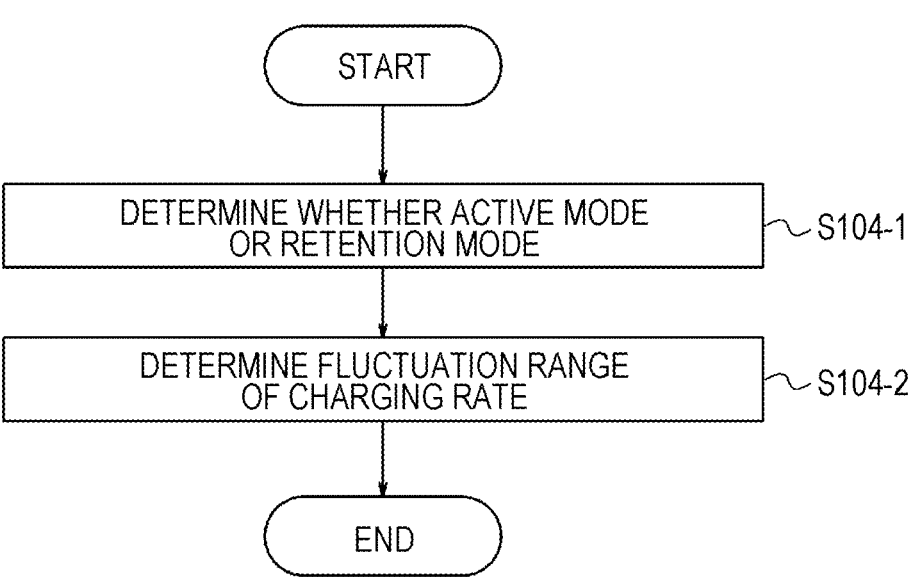
FIG. 3 is a flowchart illustrating the details of a part of the process illustrated in FIG. 2.
Figure 4:
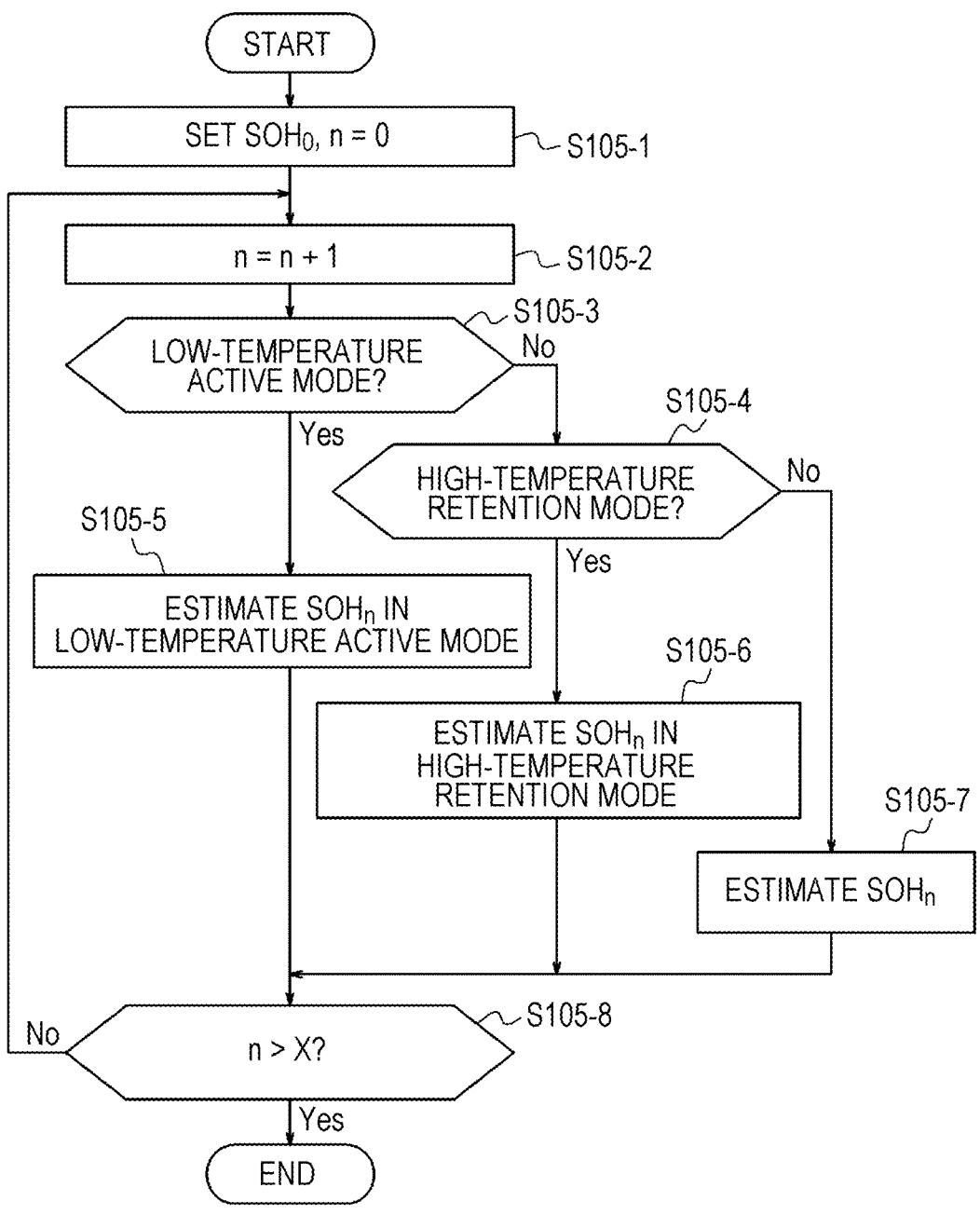
FIG. 4 is a flowchart illustrating the details of another part of the process illustrated in FIG. 2.

With reference to FIG. 2, FIG. 3, and FIG. 4, an example of a process for estimating the degree of degradation of the storage battery 3 performed by the storage battery management device 7 according to this embodiment will be described. This process corresponds to the storage battery management method according to this embodiment. FIG. 2 is a flowchart of an example of the process performed by the storage battery management device 7. FIG. 3 is a flowchart illustrating the details of a part of the process performed by the storage battery management device 7 illustrated in FIG. 2. FIG. 4 is a flowchart illustrating the details of another part of the process performed by the storage battery management device 7 illustrated in FIG. 2.

With reference to FIG. 2, in step S101, the control unit 71 performs initialization necessary for this process.

Specifically, the control unit 71 obtains the initial value of the charging rate of the storage battery 3 and the initial value of the degree of degradation of the storage battery 3, the initial values being stored in the storage unit 73. The initial value of the charging rate and the initial value of the degree of degradation are values of the charging rate and the degree of degradation of the storage battery 3 at the start of this process respectively. The initial value of the charging rate of the storage battery 3 and the initial value of the degree of degradation of the storage battery 3 are the charging rate and the degree of degradation of the storage battery 3 calculated in a previously performed process that is the same as this process. Instead of the values calculated in a process the same as this process, the control unit 71 may use, for example, an actually measured value of the charging rate of the storage battery 3 and an actually measured value of the degree of degradation of the storage battery 3 obtained by operating the storage battery 3 in a specific operation state, as the initial value of the charging rate of the storage battery 3 and the initial value of the degree of degradation of the storage battery 3.

Further, the control unit 71 starts a target period for which estimation of the degree of degradation of the storage battery 3 is performed in this process. Specifically, the control unit 71 stores the current date and time in the storage unit 73 as the start date and time of the target period for which estimation of the degree of degradation of the storage battery 3 is performed in this process. Hereinafter, the target period for which estimation of the degree of degradation of the storage battery 3 is performed in this process may be also simply referred to as "target period".

In step S102, the control unit 71 obtains the current value of the current flowing through the storage battery 3, the temperature of the storage battery 3, and the charging rate of the storage battery 3.

Specifically, the control unit 71 communicates with the current sensor 4 via the communication unit 72 and receives a current value, which is measured by the current sensor 4 at intervals of, for example, one second, as the current value of the current flowing through the storage battery 3. The control unit 71 communicates with the temperature sensor 5 via the communication unit 72 and receives a temperature, which is measured by the temperature sensor 5 at intervals of, for example, one second, as the temperature of the storage battery 3. Further, the control unit 71 calculates the charging rate of the storage battery 3 on the basis of the initial value of the charging rate and the received current value of the current flowing through the storage battery 3 by using, for example, a current integration method. The control unit 71 stores the current value, temperature, and charging rate of the storage battery 3 in the storage unit 73 as information about the current value, temperature, and charging rate of the storage battery 3 obtained during the target period.

The method for the control unit 71 to obtain the current value of the current flowing through the storage battery 3, the temperature of the storage battery 3, and the charging rate of the storage battery 3 is not limited to the above-described example. For example, the control unit 71 may communicate with the voltage sensor 6 and calculates the charging rate of the storage battery 3 on the basis of the value of the open-circuit voltage of the storage battery 3.

In a case where information obtained during the target period is already stored in the storage unit 73, the control unit 71 adds the newly obtained current value, temperature, and charging rate of the storage battery 3 to the information obtained during the target period. The control unit 71 may store the obtained current value, temperature, and charging rate of the storage battery 3 in the storage unit 73 as is as raw data or may store, for example, the average or a representative value of obtained current values of the storage battery 3, that of obtained temperatures of the storage battery 3, and that of obtained charging rates of the storage battery 3 during each specified period (for example, every hour).

In step S103-1 and step S103-2, the control unit 71 determines at a predetermined timing whether the storage battery 3 is fully charged or a predetermined period elapses without the storage battery 3 being fully charged.

Specifically, in step S103-1, the control unit 71 determines at a predetermined timing on the basis of the obtained charging rate of the storage battery 3, whether the storage battery 3 is fully charged. In this embodiment, the predetermined timing is a timing periodically repeated at intervals of, for example, one hour. However, the predetermined timing is not limited to the timing periodically repeated at intervals of one hour, and the predetermined timing may be periodically repeated at any time intervals or may be repeated non-periodically. If it is determined that the storage battery 3 is not fully charged (No in step S103-1), the control unit 71 further determines in step S103-2 whether the predetermined period elapses without the storage battery 3 being fully charged. This embodiment assumes that the predetermined period is, for example, one week. The control unit 71 determines whether the time elapsed since the start date and time of the target period stored in the storage unit 73 is longer than or equal to the predetermined period. If it is determined that the storage battery 3 is not fully charged and that the predetermined period does not elapse since the start date and time of the target period (No in step S103-2), the control unit 71 repeatedly performs the process in step S102.

If it is determined that the storage battery 3 is fully charged (Yes in step S103-1) or if it is determined that the predetermined period elapses without the storage battery 3 being fully charged (Yes in step S103-2), the control unit 71 ends the target period. Specifically, the control unit 71 stores the current date and time in the storage unit 73 as the end date and time of the target period and starts the process in step S104.

Figure 5:
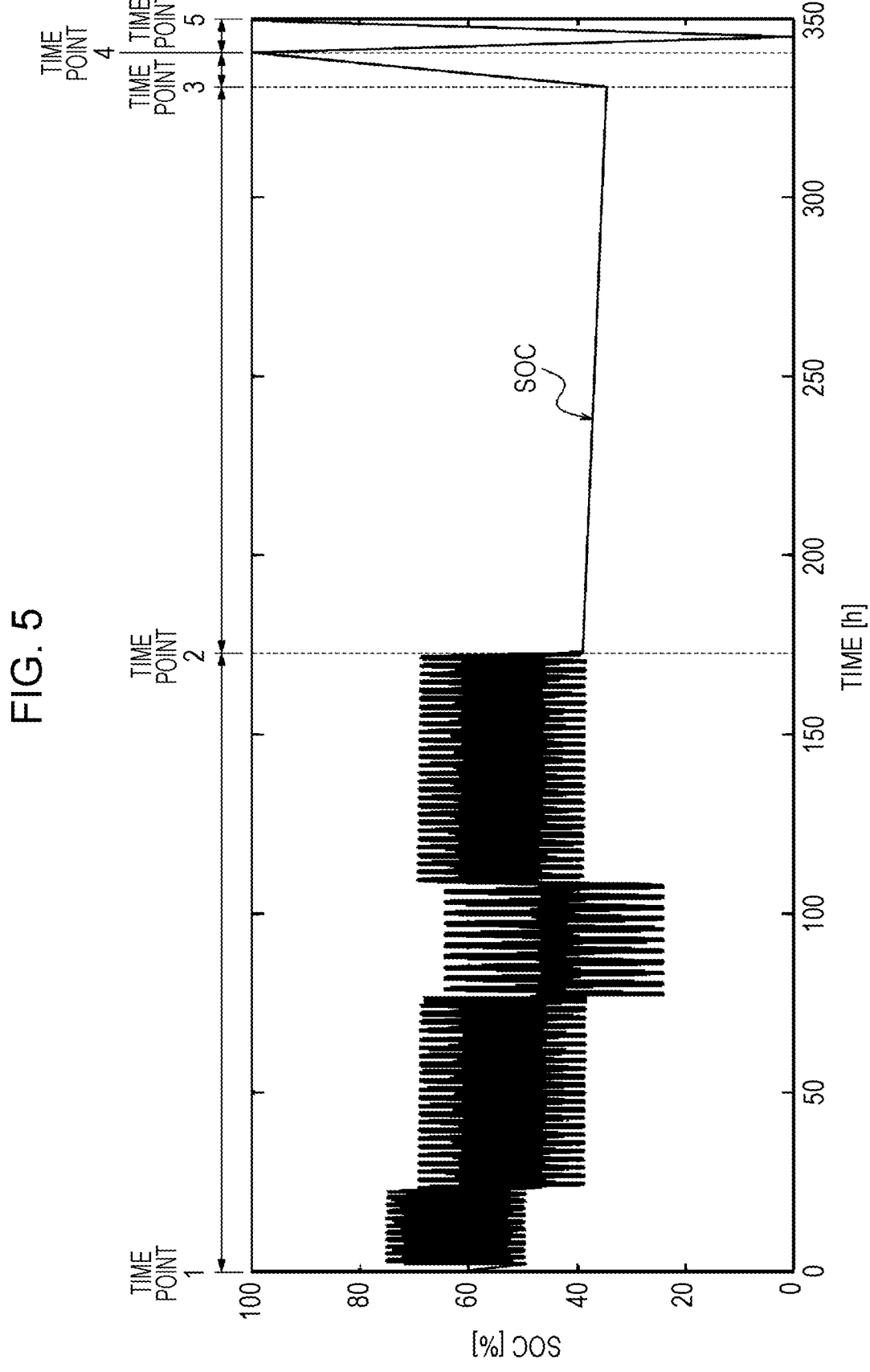
FIG. 5 is a diagram illustrating example changes in the charging rate of a storage battery over time.

With reference to FIG. 5, a specific example of the determination process performed by the control unit 71 in step S103-1 and step S103-2 will be described. FIG. 5 illustrates example changes in the charging rate (SOC) of the storage battery 3 over time. When this process is started at time point 1, the control unit 71 repeats determination in step S103-1 and that in step S103-2 at intervals of one hour. For example, in a case where the charging rate of the storage battery 3 changes in time series as illustrated in FIG. 5, the control unit 71 can determine at time point 2 that one week elapses without the storage battery 3 being fully charged. Accordingly, the control unit 71 starts the process in step S104 while assuming the period from time point 1 to time point 2 as the target period. Similarly, the control unit 71 determines at time point 3 that one week elapses without the storage battery 3 being fully charged, and starts the process in step S104 while assuming the period from time point 2 to time point 3 as the target period. The SOC of the storage battery 3 reaches 100% at time point 4, and therefore, the control unit 71 can determine that the storage battery 3 is fully charged. Accordingly, the control unit 71 starts the process in step S104 while assuming the period from time point 3 to time point 4 as the target period. Similarly, the control unit 71 determines at time point 5 that the storage battery 3 is fully charged, and starts the process in step S104 while assuming the period from time point 4 to time point 5 as the target period. Accordingly, the control unit 71 repeats determination in step S103-1 and that in step S103-2. If any of the conditions is satisfied, the control unit 71 identifies the target period and starts the process in step S104.

Referring back to FIG. 2, in step S104, the control unit 71 determines the operation mode of the storage battery 3 during the target period on the basis of the current value and the charging rate of the storage battery 3.

With reference to FIG. 3, the process for determining the operation mode of the storage battery 3 during the target period performed by the control unit 71 will be described in detail.

In step S104-1, the control unit 71 determines whether the operation mode is the active mode in which charging or discharging is performed or the retention mode in which electric power is retained.

Specifically, the control unit 71 determines whether the operation mode of the storage battery 3 is the active mode or the retention mode on the basis of current values included in information obtained during the target period and stored in the storage unit 73. In a case where the current values obtained during the target period include a current value for which the absolute value is greater than or equal to a predetermined value, the control unit 71 determines that an amount of electric power greater than or equal to a predetermined amount is input to or output from the storage battery 3. Accordingly, the control unit 71 determines that the operation mode of the storage battery 3 during the target period is the active mode. On the other hand, in a case where the current values obtained during the target period do not include a current value for which the absolute value is greater than or equal to the predetermined value, the control unit 71 determines that electric power is not input to or output from the storage battery 3 but is retained in the storage battery 3. Accordingly, the control unit 71 determines that the operation mode of the storage battery 3 during the target period is the retention mode.

As illustrated in FIG. 5, for example, during periods in which the storage battery 3 is charged and/or discharged, such as the period from time point 1 to time point 2, the period from time point 3 to time point 4, and the period from time point 4 to time point 5, the SOC of the storage battery 3 changes and the magnitude of the current flowing through the storage battery 3 increases. Accordingly, in a case where the current values obtained during the target period include a current value for which the absolute value is greater than or equal to the predetermined value, the control unit 71 can determine that the storage battery 3 is in the active mode. On the other hand, during a period in which the storage battery 3 retains electric power, such as the period from time point 2 to time point 3, the SOC of the storage battery 3 changes to a small degree, and the magnitude of the current flowing through the storage battery 3 decreases. Accordingly, in a case where the current values obtained during the target period do not include a current value for which the absolute value is greater than or equal to the predetermined value, the control unit 71 can determine that the storage battery 3 is in the retention mode.

Referring back to FIG. 3, in step S104-2, the control unit 71 determines the fluctuation range of the charging rate of the storage battery 3 during the target period.

Specifically, the control unit 71 determines the fluctuation range of the charging rate of the storage battery 3 during the target period on the basis of charging rates included in information obtained during the target period and stored in the storage unit 73. The control unit 71 extracts the maximum value and the minimum value from among the charging rates obtained during the target period and assumes the range from the minimum value to the maximum value to be the fluctuation range of the charging rate.

The control unit 71 may store in advance a plurality of operation modes having different fluctuation ranges of the charging rate, in the storage unit 73 as illustrated in FIG. 6. The control unit 71 may determine from among the plurality of operation modes, an operation mode for which the fluctuation range of the charging rate includes the maximum value and the minimum value among the charging rates obtained during the target period. The control unit 71 stores in the storage unit 73 the determined operation mode of the storage battery 3 during the target period.

As illustrated in FIG. 5, for example, in the period from time point 1 to time point 2, the minimum value and the maximum value among the obtained charging rates are 25% and 75% respectively, and therefore, the control unit 71 determines that the operation mode of the storage battery 3 is operation mode 5 that is the active mode for which the fluctuation range of the charging rate is from 20% to 80%. In the period from time point 2 to time point 3, the fluctuation range of the obtained charging rate is from 35% to 40%, and therefore, the control unit 71 determines that the operation mode of the storage battery 3 is operation mode 8 that is the retention mode for which the fluctuation range of the charging rate is from 20% to 80%. In the period from time point 3 to time point 4, the fluctuation range of the obtained charging rate is from 35% to 100%, and therefore, the control unit 71 determines that the operation mode of the storage battery 3 is operation mode 1 that is the active mode for which the fluctuation range of the charging rate is from 20% to 100%. In the period from time point 4 to time point 5, the fluctuation range of the obtained charging rate is from 0% to 100%, and therefore, the control unit 71 determines that the operation mode of the storage battery 3 is operation mode 2 that is the active mode for which the fluctuation range of the charging rate is from 0% to 100%.

The control unit 71 determines, in determination of the fluctuation range of the charging rate, whether the fluctuation range of the charging rate extends to at least one of a range from a fully discharged level to a first charging rate of the storage battery 3 or a range from a fully charged level to a second charging rate of the storage battery 3. It is known that in a case where the storage battery 3 is operated or retains electric power when the charging rate of the storage battery 3 is in a neighborhood of the fully discharged level or the fully charged level, the storage battery 3 generally degrades to a larger degree than in the other cases. The neighborhood of the fully discharged level of the storage battery 3 may be assumed to be a range in which the charging rate of the storage battery 3 is less than or equal to the first charging rate, and the neighborhood of the fully charged level of the storage battery 3 may be assumed to be a range in which the charging rate of the storage battery 3 is greater than or equal to the second charging rate. This embodiment assumes that a range in which the charging rate is less than or equal to 20% is assumed to be the neighborhood of the fully discharged level, and a range in which the charging rate is greater than or equal to 80% is assumed to be the neighborhood of the fully charged level. Therefore, in this embodiment, as illustrated in FIG. 6, the plurality of operation modes are classified into patterns on the basis of whether the fluctuation range of the charging rate extends to at least one of the neighborhood of the fully discharged level of the storage battery 3 or the neighborhood of the fully charged level of the storage battery 3. When the plurality of operation modes thus classified into patterns are used, the control unit 71 can determine whether the fluctuation range of the charging rate extends to at least one of the range from the fully discharged level to the first charging rate of the storage battery 3 or the range from the fully charged level to the second charging rate of the storage battery 3. Note that the number of operation modes and the fluctuation ranges of the charging rate in the respective operation modes are not limited to the above-described examples and may be specified as desired in accordance with the characteristics of the storage battery 3.

Referring back to FIG. 2, in step S105, the control unit 71 estimates the degree of degradation of the storage battery 3 during the target period.

Specifically, the control unit 71 estimates the degree of degradation of the storage battery 3 during the target period on the basis of the operation mode of the storage battery 3 during the target period and temperatures included in information obtained during the target period, the operation mode and the information being stored in the storage unit 73.

The method for estimating the degree of degradation of the storage battery 3 in this embodiment will be described. In this embodiment, the degree of degradation of the storage battery 3 is estimated on the basis of the Arrhenius law. The Arrhenius law is for predicting the temperature dependence of a chemical reaction rate, as expressed by expression (1) below.

$$\alpha = A\exp(-Ea/RT) \tag{1}$$

where
$\alpha$: reaction rate constant,
A: frequency factor,
Ea: activation energy,
R: gas constant, and
T: absolute temperature.

When the reaction rate constant $\alpha$ calculated by using expression (1) is used, the degree of degradation of the storage battery 3 is expressed by expression (2) below.

$$SOH = \alpha(t)^{\beta} \tag{2}$$

where
SOH: degree of degradation,
$\alpha$: reaction rate constant,
t: elapsed time, and
$\beta$: degradation index.

In expression (2), the degree of degradation at a specific time point where a time t elapses is denoted by $SOH_{(n-1)}$, and the degree of degradation at a time point $t+\Delta t$ where a time interval $\Delta t$ further elapses in addition to the elapsed time t is denoted by $SOH_n$. Then, the degrees of degradation $SOH_{(n-1)}$ and $SOH_n$ are expressed by expression (3) and expression (4) below respectively.

$$SOH_{(n-1)} = \alpha(t)^{\beta} \tag{3}$$

$$SOH_n = \alpha(t+\Delta T)^{\beta} \tag{4}$$

From expression (3) and expression (4), $SOH_n$ after the elapse of $\Delta t$ since the specific time point is expressed by expression (5) below on the basis of the degree of degradation $SOH_{(n-1)}$ at the specific time point.

$$SOH_n = \alpha((SOH_{(n-1)})^{\beta} + \Delta t)^{(1/\beta)} = f(SOH_{(n-1)}) \tag{5}$$

where
$\alpha$: reaction rate constant,
$\beta$: degradation index,
$\Delta t$: time interval, and
n: natural number greater than or equal to 1.

The reaction rate constant $\alpha$ and the degradation index $\beta$ in expression (5) vary in accordance with, for example, whether the storage battery 3 is charged or discharged or the storage battery 3 retains electric power, the charging rate of the storage battery 3, and the temperature of the storage battery 3. Accordingly, this embodiment assumes that on the basis of degrees of degradation measured by operating the storage battery 3 while changing conditions of the charging rate, temperature, and operation mode of the storage battery 3, the reaction rate constant $\alpha$ and the degradation index $\beta$ are set in advance for each of the plurality of operation modes illustrated in FIG. 6.

FIG. 7 illustrates example correspondences between conditions of operation modes in which and temperatures at which the storage battery 3 is operated in the active mode of the storage battery 3, and the reaction rate constant $\alpha$ and the degradation index $\beta$. FIG. 8 illustrates example correspondences between conditions of operation modes in which and temperatures at which the storage battery 3 is operated in the retention mode of the storage battery 3, and the reaction rate constant $\alpha$ and the degradation index $\beta$. The control unit 71 stores in advance the correspondences illustrated in FIG. 7 and FIG. 8 and expression (5) in the storage unit 73 as correspondence information about correspondences between conditions of operation modes in which and temperatures at which the storage battery 3 is operated, and the degrees of degradation of the storage battery 3 when the storage battery 3 is operated under the respective conditions. The control unit 71 may store the correspondences illustrated in FIG. 7 and FIG. 8 in the storage unit 73 as a look-up table.

The control unit 71 estimates the degree of degradation of the storage battery 3 during the target period on the basis of the operation mode and the temperature with reference to the correspondence information.

With reference to FIG. 4, the details of the process for estimating the degree of degradation of the storage battery 3 during the target period performed by the control unit 71 will be described. For example, it is supposed that X temperatures of the storage battery 3 are obtained at time intervals $\Delta t$ during the target period. In step S105-1, the control unit 71 sets the initial value of the degree of degradation of the storage battery 3 obtained in step S101 as $SOH_0$ and sets a repetition count n to 0 as the initial value.

Next, the control unit 71 repeats the process from step S105-2 to step S105-8 X times. That is, the control unit 71 performs the process from step S105-2 to step S105-8 for all of the X temperatures of the storage battery 3 obtained during the target period. Accordingly, the control unit 71 can calculate, for the target period, the degree of degradation $SOH_n$ of the storage battery 3 at each time point n (n is a natural number from 1 to X), the time points being at time intervals of $\Delta t$, from the degree of degradation $SOH_0$ of the storage battery 3 at the initial start time point.

Specifically, in step S105-2, the control unit 71 increments the repetition count n by 1.

The control unit 71 performs the process in one of step S105-5, step S105-6, or step S105-7 on the basis of determination performed in step S105-3 and step S105-4 and calculates $SOH_n$ at a time point where a time $\Delta t \times n$ elapses. It is known that in a case where the storage battery 3 is charged or discharged at a low temperature or the storage battery 3 retains electric power at a high temperature, the storage battery 3 generally degrades to a larger degree than in the other cases. Therefore, the control unit 71 determines in step S105-3 whether the operation state of the storage battery 3 is an operation state in which the storage battery 3 is charged or discharged at a low temperature and determines in step S105-4 whether the operation state of the storage battery 3 is an operation state in which the storage battery 3 retains electric power at a high temperature. In accordance with the results of determination, the control unit 71 proceeds to one of step S105-5, step S105-6, or step S105-7 and estimates the degree of degradation of the storage battery 3.

In step S105-3, the control unit 71 determines whether the operation state of the storage battery 3 is an operation state in which the storage battery 3 is charged or discharged at a low temperature. Specifically, the control unit 71 determines whether the operation mode determined in step S104 is the active mode and the temperature of the storage battery 3 is lower than or equal to a first temperature. The first temperature is set to, for example, 25° C. but is not limited to this. In this embodiment, the active mode in which the temperature of the storage battery 3 is lower than or equal to the first temperature is also referred to as "low-temperature active mode".

If it is determined that the operation mode is the low-temperature active mode (Yes in step S105-3), the control unit 71 proceeds to step S105-5 and estimates the degree of degradation in the low-temperature active mode. In estimation of the degree of degradation in step S105-5, in a case where the temperature is lower than or equal to the first temperature, the control unit 71 increases the amount of change, corresponding to the temperature, in the degree of degradation per unit time, unlike in a case where the temperature is higher than the first temperature.

Specifically, the control unit 71 calculates the degree of degradation of the storage battery 3 in a case where the temperature is lower than or equal to the first temperature by using expression (7) obtained by correcting expression (5) above with expression (6) below.

$$f\_low(SOH_{(n-1)}) = \alpha'((SOH_{(n-1)})^{\beta'} + \Delta t)^{(1/\beta')} \tag{6}$$

where
$\alpha'$: reaction rate constant in a case of a low temperature,
$\beta'$: degradation index in a case of a low temperature,
$\Delta t$: time interval, and
n: natural number greater than or equal to 1.

$$SOH_n = f(SOH_{(n-1)}) + f\_low(SOH_{(n-1)}) \tag{7}$$

Here, the control unit 71 uses the correspondences, illustrated as "low-temperature active mode" in FIG. 7 and stored in advance in the storage unit 73, between conditions of operation modes in which and temperatures at which the storage battery 3 is operated, and the reaction rate constant $\alpha'$ in a case of a low temperature and the degradation index $\beta'$ in a case of a low temperature used in expression (6) above. Accordingly, the control unit 71 calculates the degree of degradation of the storage battery 3 in the low-temperature active mode.

For example, in a case where the operation mode is operation mode 1 and the temperature is 25° C. at a certain time point, the control unit 71 can determine from the correspondence information illustrated in FIG. 7 that the reaction rate constant $\alpha$ and the degradation index $\beta$ used in expression (5), expression (6), and expression (7) above are 0.360 and 0.5 respectively and that the reaction rate constant $\alpha'$ in a case of a low temperature and the degradation index $\beta'$ in a case of a low temperature are 0.002 and 0.7 respectively.

The control unit 71 stores the degree of degradation $SOH_n$ of the storage battery 3 calculated in step S105-5 in the storage unit 73 as the degree of degradation of the storage battery 3 at the time point n.

Referring back to FIG. 4, if it is determined that the operation mode of the storage battery 3 is not the low-temperature active mode (No in step S105-3), the control unit 71 proceeds to step S105-4 and determines whether the operation state of the storage battery 3 is an operation state in which the storage battery 3 retains electric power at a high temperature. Specifically, the control unit 71 determines whether the operation mode determined in step S104 is the retention mode and the temperature of the storage battery 3 is higher than or equal to a second temperature. The second temperature is set to, for example, 40° C. but is not limited to this. In this embodiment, the retention mode in which the temperature of the storage battery 3 is higher than or equal to the second temperature is also referred to as "high-temperature retention mode".

If it is determined that the operation mode of the storage battery 3 is the high-temperature retention mode (Yes in step S105-4), the control unit 71 proceeds to step S105-6. In estimation of the degree of degradation in step S105-6, in a case where the temperature is higher than or equal to the second temperature, the control unit 71 increases the amount of change, corresponding to the temperature, in the degree of degradation per unit time, unlike in a case where the temperature is lower than the second temperature.

Specifically, the control unit 71 calculates the degree of degradation of the storage battery 3 in a case where the temperature is higher than or equal to the second temperature by using expression (9) obtained by correcting expression (5) above with expression (8) below.

$$f\_high(SOH_{(n-1)})=\alpha''((SOH_{(n-1)})^{\beta''}+\Delta t)^{(1/\beta'')} \qquad (8)$$

where
α": reaction rate constant in a case of a high temperature,
β": degradation index in a case of a high temperature,
Δt: time interval, and
n: natural number greater than or equal to 1.

$$SOH_n=f(SOH_{(n-1)})+f\_high(SOH_{(n-1)}) \qquad (9)$$

Here, the control unit 71 uses the correspondences, illustrated as "high-temperature retention mode" in FIG. 8 and stored in advance in the storage unit 73, between conditions of operation modes in which and temperatures at which the storage battery 3 is operated, and the reaction rate constant α" in a case of a high temperature and the degradation index β" in a case of a high temperature used in expression (8) above. Accordingly, the control unit 71 calculates the degree of degradation of the storage battery 3 in the high-temperature retention mode.

For example, in a case where the operation mode is operation mode 6 and the temperature is 40° C. at a certain time point, the control unit 71 can determine from the correspondence information illustrated in FIG. 8 that the reaction rate constant α and the degradation index β used in expression (5), expression (8), and expression (9) above are 0.520 and 0.4 respectively and that the reaction rate constant α" in a case of a high temperature and the degradation index β" in a case of a high temperature are 0.001 and 0.6 respectively.

The control unit 71 stores the degree of degradation $SOH_n$ of the storage battery 3 calculated in step S105-6 in the storage unit 73 as the degree of degradation of the storage battery 3 at the time point n.

Referring back to FIG. 4, if it is determined that the operation mode of the storage battery 3 is not the high-temperature retention mode (No in step S105-4), the control unit 71 proceeds to step S105-7 and calculates the degree of degradation of the storage battery 3 by using expression (5) above.

Specifically, the control unit 71 calculates the degree of degradation of the storage battery 3 by using expression (5) above. Here, the control unit 71 uses the correspondences, as illustrated in FIG. 7 and FIG. 8 and stored in advance in the storage unit 73, between conditions of operation modes in which and temperatures at which the storage battery 3 is operated, and the reaction rate constant α and the degradation index β used in expression (5) above. Accordingly, the control unit 71 calculates the degree of degradation of the storage battery 3.

The control unit 71 stores the degree of degradation $SOH_n$ of the storage battery 3 calculated in step S105-7 in the storage unit 73 as the degree of degradation of the storage battery 3 at the time point n.

Referring back to FIG. 4, in step S105-8, the control unit 71 determines whether the process for estimating the degree of degradation from step S105-2 to step S105-7 is repeated X times. If it is determined that the process for estimating the degree of degradation is not repeated X times (No in step S105-8), the control unit 71 repeats the process from step S105-2. On the other hand, if it is determined that the process for estimating the degree of degradation is repeated X times (Yes in step S105-8), the control unit 71 stores the degree of degradation $SOH_x$ of the storage battery 3 at the time point X in the storage unit 73 as the degree of degradation of the storage battery 3 at the end time point of the target period. The control unit 71 may output the estimated degree of degradation of the storage battery 3 to the output unit 74.

Referring back to FIG. 2, when the process in step S105 ends, the control unit 71 ends this process. After the end of this process, the control unit 71 may start the process from step S101 again.

As described above, the storage battery management device 7 according to this embodiment includes the control unit 71 that obtains the current value of the current flowing through the storage battery 3, the temperature of the storage battery 3, and the charging rate of the storage battery 3 during the target period, determines the operation mode of the storage battery 3 during the target period on the basis of the current value and the charging rate, and estimates the degree of degradation of the storage battery 3 during the target period on the basis of the operation mode and the temperature. With the above-described configuration, the storage battery management device 7 can estimate the degree of degradation of the storage battery 3 on the basis of information about the storage battery 3 obtained during a normal operation of the storage battery 3 without operating the storage battery 3 in a specific operation state. Accordingly, the usefulness of the technique for managing the storage battery 3 is increased.

The storage battery management device 7 according to this embodiment can further include the storage unit 73 that stores correspondence information about correspondences between conditions of operation modes in which and temperatures at which the storage battery 3 is operated, and degrees of degradation of the storage battery 3 when the storage battery 3 is operated under the respective conditions, and the control unit 71 can estimate the degree of degradation of the storage battery 3 during the target period on the basis of the operation mode and the temperature with reference to the correspondence information. The correspondence information may be, for example, a look-up table for identifying the reaction rate constant α and the degradation index β. With the above-described configuration, in calculation of the degree of degradation of the storage battery 3 performed by the storage battery management device 7, elements that can be calculated in advance are calculated and stored in the storage unit 73 as the correspondence information. Accordingly, the processing capacity including the processing speed and the amount of data required for the storage battery management device 7 can be reduced.

In the storage battery management device 7 according to this embodiment, in determination of the operation mode, the control unit 71 can determine whether the operation mode is the active mode in which charging or discharging is performed or the retention mode in which electric power is retained. With the above-described configuration, the storage battery management device 7 can change the method for calculating the degree of degradation of the storage battery 3 in accordance with whether the storage battery 3 is in the active mode or in the retention mode and can increase the accuracy of estimation of the degree of degradation of the storage battery 3. In the method for calculating the degree of degradation of the storage battery 3 in this embodiment, the same calculation logic is used for both the active mode and the retention mode, and the method for calculation is changed by changing the correspondence information to be referred to. As a result, the processing capacity required for the storage battery management device 7 can be reduced.

In the storage battery management device 7 according to this embodiment, in determination of the operation mode, the control unit 71 can determine the fluctuation range of the charging rate of the storage battery 3 during the target period. With the above-described configuration, the storage battery management device 7 can change the method for calculating the degree of degradation of the storage battery 3 in accordance with the fluctuation range of the charging rate of the storage battery 3 and can reflect the degradation characteristics corresponding to the charging rate of the storage battery 3 to calculation of the degree of degradation of the storage battery 3. Accordingly, the storage battery management device 7 can increase the accuracy of estimation of the degree of degradation of the storage battery 3.

In the storage battery management device 7 according to this embodiment, the control unit 71 can determine whether the fluctuation range of the charging rate extends to at least one of the range from the fully discharged level to the first charging rate of the storage battery 3 or the range from the fully charged level to the second charging rate of the storage battery 3. With the above-described configuration, in a specific case where charging or discharging is performed or electric power is retained when the charging rate of the storage battery 3 is in the neighborhood of the fully discharged level or in the neighborhood of the fully charged level, and consequently, the storage battery 3 degrades to a large degree, the storage battery management device 7 can change the method for calculating the degree of degradation of the storage battery 3. Accordingly, the storage battery management device 7 can increase the accuracy of estimation of the degree of degradation of the storage battery 3.

In the storage battery management device 7 according to this embodiment, when the operation mode is determined to be the active mode, in estimation of the degree of degradation, in a case where the temperature is lower than or equal to the first temperature, the control unit 71 can increase the amount of change, corresponding to the temperature, in the degree of degradation per unit time, unlike in a case where the temperature is higher than the first temperature. With the above-described configuration, in a specific case where the storage battery 3 is charged or discharged at a low temperature, and consequently, the storage battery 3 degrades to a large degree, the storage battery management device 7 can change the method for calculating the degree of degradation of the storage battery 3. Accordingly, the storage battery management device 7 can reflect the degradation characteristics corresponding to the temperature of the storage battery 3 to calculation of the degree of degradation of the storage battery 3 and can increase the accuracy of estimation of the degree of degradation of the storage battery 3.

In the storage battery management device 7 according to this embodiment, when the operation mode is determined to be the retention mode, in estimation of the degree of degradation, in a case where the temperature is higher than or equal to the second temperature, the control unit 71 can increase the amount of change, corresponding to the temperature, in the degree of degradation per unit time, unlike in a case where the temperature is lower than the second temperature. With the above-described configuration, in a specific case where the storage battery 3 retains electric power at a high temperature, and consequently, the storage battery 3 degrades to a large degree, the storage battery management device 7 can change the method for calculating the degree of degradation of the storage battery 3. Accordingly, the storage battery management device 7 can reflect the degradation characteristics corresponding to the temperature of the storage battery 3 to calculation of the degree of degradation of the storage battery 3 and can increase the accuracy of estimation of the degree of degradation of the storage battery 3.

In the storage battery management device 7 according to this embodiment, the control unit 71 can determine at the predetermined timing whether the storage battery 3 is fully charged, and in a case where the control unit 71 determines that the storage battery 3 is fully charged or determines that the predetermined period elapses without the storage battery 3 being fully charged, the control unit 71 can end the target period and start a new target period. With the above-described configuration, the storage battery management device 7 can periodically calculate the degree of degradation of the storage battery 3.

The storage battery system 1 according to this embodiment includes the storage battery 3 and the storage battery management device 7 including the control unit 71. The control unit 71 obtains the current value of the current flowing through the storage battery 3, the temperature of the storage battery 3, and the charging rate of the storage battery 3 during the target period, determines the operation mode of the storage battery 3 during the target period on the basis of the current value and the charging rate, and estimates the degree of degradation of the storage battery 3 during the target period on the basis of the operation mode and the temperature. With the above-described configuration, the storage battery system 1 can estimate the degree of degradation of the storage battery 3 on the basis of information about the storage battery 3 obtained by the storage battery management device 7 during a normal operation of the storage battery 3 without operating the storage battery 3 in a specific operation state. Accordingly, the usefulness of the technique for managing the storage battery 3 is increased.

The storage battery management method according to this embodiment is a storage battery management method to be performed by the storage battery management device 7 including the control unit 71. The storage battery management method includes a step, by the control unit 71, of obtaining the current value of the current flowing through the storage battery 3, the temperature of the storage battery 3, and the charging rate of the storage battery 3 during the target period, a step, by the control unit 71, of determining the operation mode of the storage battery 3 during the target period on the basis of the current value and the charging rate, and a step, by the control unit 71, of estimating the degree of degradation of the storage battery 3 during the target period on the basis of the operation mode and the temperature. With the above-described configuration, the storage battery management device 7 can estimate the degree of degradation of the storage battery 3 on the basis of information about the storage battery 3 obtained during a normal operation of the storage battery 3 without operating the storage battery 3 in a specific operation state. Accordingly, the usefulness of the technique for managing the storage battery 3 is increased.

Although the present disclosure has been described with reference to the drawings and the embodiment, it should be noted that a person skilled in the art can make various modifications and corrections on the basis of the present disclosure. Therefore, it should be understood that these modifications and corrections are included in the scope of the present disclosure. For example, functions included in, for example, means or steps can be rearranged so as not to cause any logical contradiction, for example, a plurality of means or a plurality of steps may be combined to form one means or one step, or one means or one step may be divided.

For example, in the above-described embodiment, although the description has been given under the assumption that the storage battery system 1 includes one current sensor 4, one temperature sensor 5, and one voltage sensor 6, the storage battery system 1 need not be configured as described above. The storage battery system 1 may include a plurality of current sensors 4, a plurality of temperature sensors 5, or a plurality of voltage sensors 6. For example, in the storage battery system 1, the current sensor 4, the temperature sensor 5, or the voltage sensor 6 may be provided for each cell 31 or each storage battery module 32 instead of storage battery 3. In this case, the storage battery management device 7 may calculate the current value, the temperature, or the voltage of the storage battery 3 by calculating, for example, the average or a representative value from values measured by the plurality of current sensors 4, the plurality of temperature sensors 5, or the plurality of voltage sensors 6.

Further, in the above-described embodiment, all or some of the functions or processes described as the functions or processes of the storage battery management device 7 may be implemented as, for example, functions or processes of a computer, such as a smartphone or a personal computer. Specifically, a program that describes the specifics of processes for implementing the functions of the storage battery management device 7 according to this embodiment can be stored in a memory of the computer, and the program can be read and executed by a processor of the computer. Therefore, the invention according to this embodiment can be implemented as a processor-executable program.

Further, in the above-described embodiment, although an example configuration has been described where the storage battery management device 7 is provided separately from the power conditioner 2 and the storage battery 3, this configuration need not be employed. For example, the power conditioner 2 or the storage battery 3 may function as the storage battery management device 7. Further, an EMS (Energy Management System), such as a HEMS (Home Energy Management System) or a BEMS (Building Energy Management System), may function as the storage battery management device 7. In these cases, the power conditioner 2, the storage battery 3, or the EMS may be configured to include a computer having a configuration and functions described above as the configuration and functions of the storage battery management device 7.

The invention claimed is:

1. A storage battery management device, comprising:
a memory storing a plurality of predetermined operation modes corresponding to predetermined fluctuation ranges of a charging rate of a storage battery, the predetermined fluctuation ranges including a first predetermined fluctuation range from a fully discharged level to a first predetermined charging rate of the storage battery, and
a second predetermined fluctuation range from a fully charged level to a second predetermined charging rate of the storage battery, the first predetermined charging rate being lower than the second predetermined charging rate; and
a control unit configured to
obtain a current value of a current flowing through the storage battery, a temperature of the storage battery, and a plurality of charging rates of the storage battery during a target period,
determine a fluctuation range of a charging rate of the storage battery defined by a maximum charging rate and a minimum charging rate extracted from among the plurality of charging rates obtained during the target period,
determine an operation mode of the storage battery during the target period based on the current value and the fluctuation range of the charging rate, and
estimate a degree of degradation of the storage battery during the target period based on the operation mode and the temperature,
wherein the control unit is configured to determine the operation mode by matching the fluctuation range defined by the maximum charging rate and the minimum charging rate to one of the predetermined fluctuation ranges corresponding to one of the plurality of predetermined operation modes.

2. The storage battery management device according to claim 1,
wherein the memory further stores correspondence information about correspondences between (i) conditions of operation modes in which the storage battery is operated and temperatures at which the storage battery is operated, and (ii) degrees of degradation of the storage battery when the storage battery is operated under the respective conditions, and
wherein the control unit is configured to estimate the degree of degradation of the storage battery during the target period based on the operation mode and the temperature with reference to the correspondence information.

3. The storage battery management device according to claim 2, wherein
the control unit is configured to classify the operation modes into operation modes corresponding to an active mode in which charging or discharging is performed and operation modes corresponding to a retention mode in which electric power is retained based on whether the fluctuation range of the charging rate of the storage battery during the target period extends to the first predetermined range or the second predetermined range,
the operation modes corresponding to the active mode are associated with different predetermined fluctuation ranges of the charging rate including the first and second predetermined fluctuation ranges, and
the operation modes corresponding to the retention mode are associated with different predetermined fluctuation ranges of the charging rate including the first and second predetermined fluctuation ranges.

4. The storage battery management device according to claim 3, wherein the control unit is configured to determine whether the fluctuation range of the charging rate extends to the first predetermined range from the fully discharged level to the first predetermined charging rate of the storage battery.

5. The storage battery management device according to claim 4, wherein the control unit is configured to determine whether the fluctuation range of the charging rate extends to the second predetermined range from the fully charged level to the second predetermined charging rate of the storage battery.

6. The storage battery management device according to claim 5, wherein the first predetermined charging rate of the storage battery is 20%, and the second predetermined charging rate of the storage battery is 80%.

7. The storage battery management device according to claim 1, wherein in determination of the operation mode, the control unit is configured to determine whether the operation mode is an active mode in which charging or discharging is performed or a retention mode in which electric power is retained.

8. The storage battery management device according to claim 7, wherein upon the operation mode being determined to be the active mode, in estimation of the degree of degradation, in a case where the temperature is lower than or equal to a first temperature, the control unit is configured to increase an amount of change, corresponding to the temperature, in the degree of degradation per unit time, unlike in a case where the temperature is higher than the first temperature.

9. The storage battery management device according to claim 7, wherein upon the operation mode being determined to be the retention mode, in estimation of the degree of degradation, in a case where the temperature is higher than or equal to a second temperature, the control unit is configured to increase an amount of change, corresponding to the temperature, in the degree of degradation per unit time, unlike in a case where the temperature is lower than the second temperature.

10. The storage battery management device according to claim 1, wherein the control unit is configured to determine at a predetermined timing whether the storage battery is fully charged, and in response to determining (i) the storage battery being fully charged or (ii) a predetermined period elapsing without the storage battery being fully charged, end the target period and start a new target period.

11. The storage battery management device according to claim 1, wherein the first predetermined charging rate of the storage battery is 20%, and the second predetermined charging rate of the storage battery is 80%.

12. The storage battery management device according to claim 1, wherein the control unit is configured to estimate the degree of degradation of the storage battery during the target period by using the operation mode, the temperature and at least one of a degradation index corresponding to the operation mode or a reaction rate constant corresponding to the operation mode.

13. A storage battery system, comprising:

a storage battery; and a storage battery management device including a memory storing a plurality of predetermined operation modes corresponding to predetermined fluctuation ranges of a charging rate of a storage battery, the predetermined fluctuation ranges including a first predetermined fluctuation range from a fully discharged level to a first predetermined charging rate of the storage battery, and a second predetermined fluctuation range from a fully charged level to a second predetermined charging rate of the storage battery, the first predetermined charging rate being lower than the second predetermined charging rate; and a control unit, wherein the control unit is configured to obtain a current value of a current flowing through the storage battery, a temperature of the storage battery, and a plurality of charging rates of the storage battery during a target period, determine a fluctuation range of a charging rate of the storage battery defined by a maximum charging rate and a minimum charging rate extracted from among the plurality of charging rates obtained during the target period, determine an operation mode of the storage battery during the target period based on the current value and the fluctuation range of the charging rate, and estimate a degree of degradation of the storage battery during the target period based on the operation mode and the temperature, and the control unit is configured to determine the operation mode by matching the fluctuation range defined by the maximum charging rate and the minimum charging rate to one of the predetermined fluctuation ranges corresponding to one of the plurality of predetermined operation modes.

14. A storage battery management method to be performed by a storage battery management device including a memory storing a plurality of predetermined operation modes corresponding to predetermined fluctuation ranges of a charging rate of a storage battery, the predetermined fluctuation ranges including a first predetermined fluctuation range from a fully discharged level to a first predetermined charging rate of the storage battery, and a second predetermined fluctuation range from a fully charged level to a second predetermined charging rate of the storage battery, the first predetermined charging rate being lower than the second predetermined charging rate; and a control unit, the storage battery management method comprising:

obtaining a current value of a current flowing through the storage battery, a temperature of the storage battery, and a plurality of charging rates of the storage battery during a target period;

determining a fluctuation range of a charging rate of the storage battery defined by a maximum charging rate and a minimum charging rate extracted from among the plurality of charging rates obtained during the target period;

determining an operation mode of the storage battery during the target period based on the current value and the fluctuation range of the charging rate; and estimating a degree of degradation of the storage battery during the target period based on the operation mode and the temperature, wherein the storage battery management method comprises: in determination of the operation mode, determining the operation mode by matching the fluctuation range defined by the maximum charging rate and the minimum charging rate to one of the predetermined fluctuation ranges corresponding to one of the plurality of predetermined operation modes.

\* \* \* \* \*